US007746711B2

(12) United States Patent
Inaba

(10) Patent No.: US 7,746,711 B2
(45) Date of Patent: Jun. 29, 2010

(54) SEMICONDUCTOR DEVICE AND SEMICONDUCTOR CHIPS OUTPUTTING A DATA STROBE SIGNAL

(75) Inventor: Hideo Inaba, Tokyo (JP)

(73) Assignee: Elpidia Memory, Inc., Tokyo (JP)

( * ) Notice: Subject to any disclaimer, the term of this patent is extended or adjusted under 35 U.S.C. 154(b) by 146 days.

(21) Appl. No.: 11/984,606

(22) Filed: Nov. 20, 2007

(65) Prior Publication Data

US 2008/0117694 A1 May 22, 2008

(30) Foreign Application Priority Data

Nov. 22, 2006 (JP) .............................. 2006-315746

(51) Int. Cl.
*G11C 7/00* (2006.01)
(52) U.S. Cl. .................. 365/193; 365/194; 365/233.15
(58) Field of Classification Search ................. 365/193, 365/194, 233.15
See application file for complete search history.

(56) References Cited

U.S. PATENT DOCUMENTS

| 5,896,347 | A | * | 4/1999 | Tomita et al. | ........... 365/233.11 |
| 6,321,343 | B1 | * | 11/2001 | Toda | ........................ 713/600 |
| 7,266,022 | B2 | | 9/2007 | Aoki | |
| 7,460,417 | B2 | * | 12/2008 | Kim et al. | ................... 365/193 |

| 2006/0233012 | A1 | * | 10/2006 | Sekiguchi et al. | ............. 365/51 |
| 2007/0240012 | A1 | * | 10/2007 | Burney et al. | ............... 713/500 |
| 2007/0291557 | A1 | | 12/2007 | Nishio et al. | |

FOREIGN PATENT DOCUMENTS

| JP | 2002-169721 | 6/2002 |
| JP | 2006-24663 | 1/2006 |
| JP | 2006-260322 | 9/2006 |
| JP | 2007-335528 | 12/2007 |

OTHER PUBLICATIONS

Japanese Office Action dated Oct. 8, 2008 with Partial English-Language Translation.

* cited by examiner

*Primary Examiner*—Hoai V Ho
(74) *Attorney, Agent, or Firm*—McGinn IP Law Group, PLLC

(57) ABSTRACT

High-speed operation is achieved without increase in a circuit current and unstable operation of data strobe signal level due to collision between data strobe signals. Each of RAMs 11a and 11b outputs a data signal DQ and a data strobe signal DQS indicative of an output timing of the data signal. RAM 11a includes a strobe signal control unit 15a that determines whether RAM 11b connected in parallel with the RAM 11a is in a read state or not, and delays an output start timing of data strobe signal DQS when the RAM 11b is in the read state. Strobe signal control unit 15a of the RAM 11a controls output start timing so that a latter half portion of a preamble period of the data strobe signal DQS to be output coincides with a postamble period of the data strobe signal DQS output by the RAM 11b.

28 Claims, 15 Drawing Sheets

SEMICONDUCTOR DEVICE AND SEMICONDUCTOR CHIPS OUTPUTTING A DATA STROBE SIGNAL

REFERENCE TO RELATED APPLICATION

The present application is claiming the priority of the earlier Japanese patent application No. 2006-315746 filed on Nov. 22, 2006, the entire disclosure thereof being incorporated herein by reference thereto.

FIELD OF THE INVENTION

The present invention relates to a semiconductor device and semiconductor chips. More specifically, the invention relates to a semiconductor device that includes a plurality of semiconductor chips and outputs a data signal and a data strobe signal indicative of an output timing of the data signal from the semiconductor chips, and the semiconductor chips in such semiconductor device.

BACKGROUND OF THE INVENTION

A DDR SDRAM (Double Data Rate Synchronous Dynamic Random Access Memory) is an SDRAM having a high-speed data transfer function capable of performing data reading and writing at both times of a rise and a fall of a clock signal (pulse) for achieving synchronization between circuits. The DDR SDRAM uses a data strobe (DQA) signal in order to inform a timing of performing data input/output with a frequency twice as fast as an external clock signal. The data strobe signal DQS is a bi-directional strobe signal, and functions as a data input/output operation reference clock at the time of a read/write operation. In the read operation, an edge of the data strobe signal DQS coincides with an edge of read data. Accordingly, when the read data is received from the DDR SDRAM, the received data strobe signal DQS is internally delayed up to the middle of the read data.

Now, assume that a read command (READ) is received in an active state the DDR SDRAM, whereupon the data strobe signal DQS changes from a high-impedance (intermediate level) to a low level. A period of this low level is a preamble which will become a preparatory period for a data latch timing. The preamble is generated approximately one clock before initial data is output. Following the preamble, the data strobe signal DQS toggles (alternates) at the same frequency as the clock signal during a period in which an effective data signal is present at a data input/output terminal (DQ). A low-level period after a last data has been transferred is a postamble. The postamble is generated during a period of approximately a half clock from an edge of the last data signal.

Accompanying increase in functions and trend of higher functionality of mobile devices in recent years, increase in the capacity and downsizing of a DDR DRAM mounted on the mobile devices are demanded. For this reason, it is necessary to further reduce the mounting area of the DDR, and reduction in the package size of the DDR DRAM is also demanded. Further, by MCP (multi chip packaging) in which two or more DDR DRAMs of the same capacity are mounted within a same package, a semiconductor device with a large capacity and a reduced mounting area is implemented. In such a semiconductor device, a plurality of DDR DRAMs are connected in parallel, accompanied by common connection of a lot of input/output signal lines.

Patent Document 1, for example, describes a semiconductor device into which a plurality of semiconductor chips each including an input/output synchronization signal terminal or an output synchronization signal terminal are incorporated. In this semiconductor device, an optional function (such as a bonding option chip, a fuse option, or the like) that brings an output of a DQS output circuit always into a high impedance state is incorporated into the DQS output circuit on a discrete chip. When DQS terminals of a plurality of semiconductor chips are connected in common, this function causes only one of the chips connected in common to output the DQS signal in a normal state and causes remaining DQS terminals to be in the high-impedance state. With this arrangement, a through current is prevented from flowing across a power supply and the ground via the DQS terminals.

Further, when the DDR DRAM is used, a higher read speed, for example, is demanded. For this reason, various proposals have been made so as to eliminate an undesired operation as much as possible. Patent Document 2, for example, discloses a memory interface control circuit capable of improving immunity of read data to glitch noise when the read data is transferred between a memory (DDR-SDRAM, or a DDR2-SDRAM, in particular) and a memory controller LSI, and alleviating a constraint on a physical arrangement relationship between the memory and the memory controller LSI.

[Patent Document 1] JP Patent Kokai Publication No. JP-P2006-24663A

[Patent Document 2] JP Patent Kokai Publication No. JP-P2006-260322A

SUMMARY OF THE DISCLOSURE

The following analysis is given by the present invention. The entire disclosures of the above mentioned Patent Documents 1 and 2 are herein incorporated by reference thereto.

The semiconductor device described in Patent Document 1 is applied to prevent collision between the DQS signals when the DQS signals are output from the DQS terminals of a plurality of the semiconductor chips at the same timing. Such semiconductor device as described above is effective only in case where data outputs from a plurality of the semiconductor chips are separated. Specifically, the semiconductor device as described above is effective in case where semiconductor chips that are different in a word width direction are connected.

In contrast therewith, when a plurality of semiconductor chips that are different in an address direction are connected in common, an appropriate operation cannot be performed just by an arrangement where only one chip outputs a normal DQS signal and the remaining DQS terminals are brought into the high-impedance state. That is, the data strobe signal for the DDR DRAM is driven low one clock before data output in order to achieve synchronization with an output timing of a data signal, thereby informing a receiver of a preparatory period (preamble) for a data latch timing. In case where the MCP is formed by using two or more DDR DRAM chips and read commands are successively received by the chips, respectively, the DQS signal is output from a chip that has first received a read command. However, a timing at which a DQS signal for data output corresponding to last two addresses from the end of the burst data goes high will coincide with a timing at which the DQS signal goes low (into the preamble) by a read command received later. Then, data of opposite polarities will be simultaneously output to DQS output drivers for the two chips.

A timing chart in this case will be shown in FIG. 14. This chart shows a case where the number of CAS latencies is set to three and the number of burst operations is set to four. For a read command input to a first chip at a timing t1, the DQS signal of the first chip outputs a preamble at a timing t3, and toggles at timings t4 and t5 in response to data (DQ) outputs. On the other hand, for a read command input to a second chip at the timing t3, the DQS signal of the second chip outputs a preamble at the timing t5. Accordingly, at a portion A of the timing t5, a timing at which the DQS signal of the first chip goes high coincides with a timing at which the DQS signal of the second chip goes low (into the preamble). For this reason, the DQS signals of opposite polarities are output simultaneously, and may cause an increase in a current of the semiconductor device and an unstable operation of a DQS signal level due to collision between the DQS signals.

Then, in order to avoid collision between data, output of the read command to be output later is waited for one clock or more so that the read command to be output later is output at the timing t4. In this case, a timing at which the DQS signal goes high at the timing t5 and a timing at which the DQS signal goes low (into the preamble) at a timing t6 are separated. Thus, the collision between the DQS signals does not occur. However, undesired time for waiting is generated at the timing t6 in view of data output. A high-speed operation cannot be therefore performed.

Accordingly, it is an object of the present invention to provide a semiconductor device and semiconductor chips that operate at high speed, without causing increase in a circuit current and unstable operation of a data strobe signal level due to collision between data strobe signals.

According to one aspect of the present invention, there is provided a semiconductor device with a plurality of semiconductor chips mounted thereon, which outputs a data signal and a data strobe signal indicative of an output timing of the data signal from (each of) the semiconductor chips. The semiconductor device has a configuration in which being temporally continuous with a data strobe signal corresponding to one of the semiconductor chips, a data strobe signal corresponding to an other one of the semiconductor chips is output so that the data strobe signal corresponding to the other one of the semiconductor chips alternates. Namely, a first data strobe signal corresponding to a first semiconductor chip is output in alternating fashion with a second strobe signal corresponding to a second semiconductor chip.

In the semiconductor device of the present invention, it is preferred that the other one of the semiconductor chips include: a strobe signal control unit that determines whether or not the one of the semiconductor chips is in a read state, and delays an output start timing of the data strobe signal when it is determined that the one of the semiconductor chips is in the read state.

In the semiconductor device of the present invention, it is preferred that the strobe signal control unit of the other one of the semiconductor chips control the output start timing so that a latter half portion of a preamble period of the data strobe signal to be output coincides with a post-amble period of the data strobe signal output by the one of the semiconductor chips.

According to another aspect of the present invention, there is provided a semiconductor chip that outputs a data signal and a data strobe signal indicative of an output timing of the data signal. The semiconductor chip includes: a strobe signal control unit that determines whether or not other semiconductor chip connected in parallel with the semiconductor chip is in a read state, and delays an output start timing of a data strobe signal when it is determined that the other semiconductor chip is in the read state.

In the semiconductor chip of the present invention, it is preferred that the strobe signal control unit control the output start timing so that a latter half portion of a preamble period of the data strobe signal to be output coincides with a post-amble period of a data strobe signal output by the other semiconductor chip.

In the semiconductor chip of the present invention, the strobe signal control unit may include: a first command determination input circuit that receives a command input signal, determines whether or not the command input signal indicates a read command to the own semiconductor chip, and outputs a first read command signal when it is determined that the command input signal indicates the read command to the own semiconductor chip; a first burst counter circuit that performs control so that when a burst enable signal and the first read command signal in the other semiconductor chip are active, a timing of activating the burst enable signal in the own semiconductor chip is delayed by a predetermined amount, the burst enable signal being a signal indicative of a sending status of the data strobe signal; and a DQS control circuit that outputs as the data strobe signal an alternating signal which includes a preamble and is synchronized with a clock signal subsequent to the preamble, corresponding to an active period of the burst enable signal in the semiconductor chip.

In the semiconductor chip of the present invention, the strobe signal control unit may further include: a DQS input circuit that buffers and outputs an output of the DQS control circuit; the burst enable signal in the other semiconductor chip being an output signal of the DQS input circuit.

In the semiconductor chip of the present invention, the strobe signal control unit may further include: a second command determination input circuit that receives the command input signal, determines whether or not the command input signal indicates a read command to the other semiconductor chip, and outputs a second read command signal when it is determined that the command input signal indicates the read command to the other semiconductor chip; and a second burst counter circuit that receives the second read command signal and activates a second burst enable signal during a period corresponding to a predetermined number of clocks; the burst enable signal in the other semiconductor chip being the second burst enable signal.

A semiconductor device of the present invention may include: a plurality of the semiconductor chips; a substrate with the plurality of the semiconductor chips mounted thereon; and wirings (lines) through which selection signals for the plurality of the semiconductor chips are delivered from the substrate.

The meritorious effects of the present invention are summarized as follows.

According to the present invention, it is determined whether or not other semiconductor chip is in a read state. When it is determined that the other semiconductor chip is in the read state, an output operation of the data strobe signal is delayed. By this delay, data of opposite levels are not simultaneously output to data strobe signal output drivers of the chips. Accordingly, increase in a circuit current and an unstable operation of a data strobe signal level due to collision between the data strobe signals will not be caused. A high-speed operation can be thereby performed.

PREFERRED MODES OF THE INVENTION

Figure 1A:
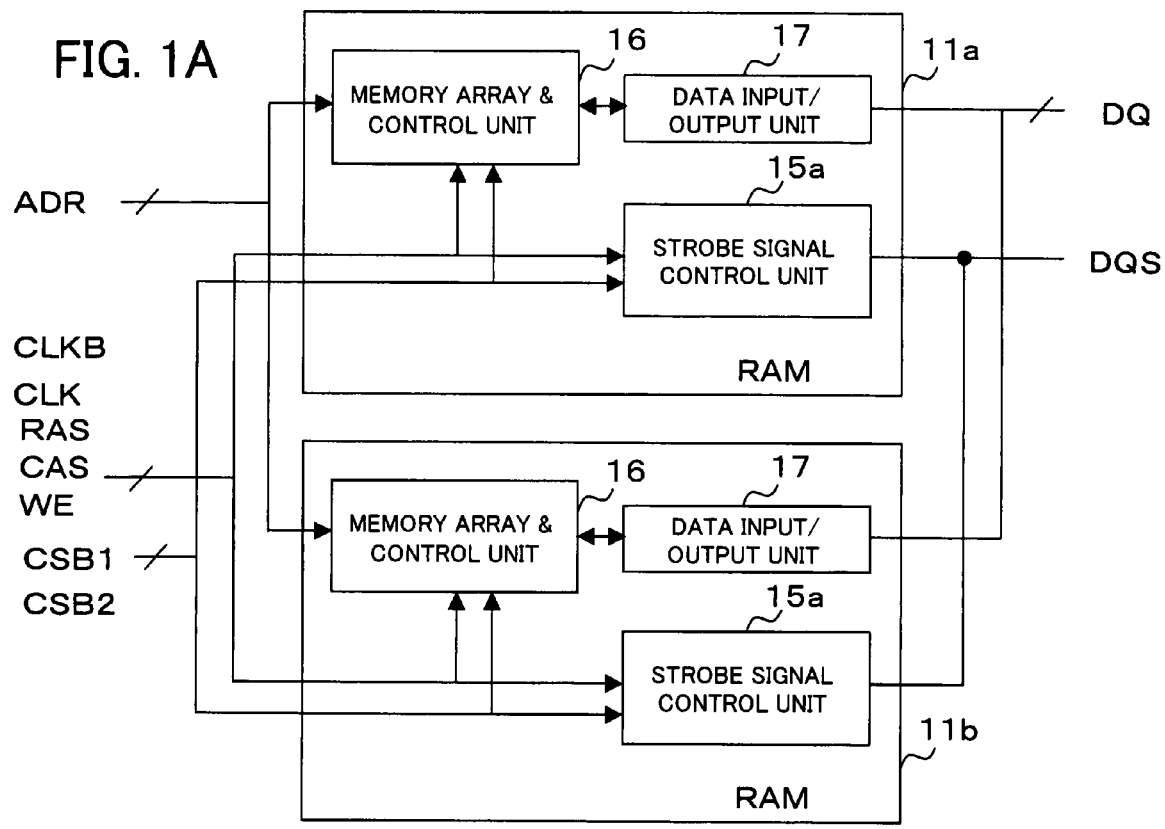
FIGS. 1A and 1B are block diagrams each showing a configuration of a semiconductor device according to a first example of the present invention.

A semiconductor chip (such as a DDR SDRAM) according to an exemplary mode of the present invention outputs a data signal (indicated by reference character DQ in FIG. 1A) and a data strobe signal (indicated by reference character DQS in FIG. 1A) indicative of an output timing of the data signal. One (first) semiconductor chip (indicated by reference numeral 11a in FIGS. 1A and 1B) includes a strobe signal control unit (indicated by reference numeral 15a in FIG. 1A) that determines whether or not other (second) semiconductor chip (indicated by reference numeral 11b in FIGS. 1A and 1B) connected in parallel with the one (first) semiconductor chip is in a read state, and delays an output start timing of the data strobe signal when it is determined that the other (second) semiconductor chip is in the read state. The strobe signal control unit controls the output start timing so that a latter half portion of a preamble period of a data strobe signal to be output (from a first semiconductor chip) coincides with a post-amble period of a data strobe signal output by the other (second) semiconductor chip. Further, a semiconductor device (MCP) includes a plurality of semiconductor chips, a substrate (indicated by reference numeral 10a in FIG. 1B) with the semiconductor chips mounted thereon, and wirings through which selection signals for the semiconductor chips are delivered from the substrate.

The semiconductor device having such a configuration in the MCP that uses a plurality of the semiconductor chips has a function of grasping input of a read command to the other (second) semiconductor chip and delaying the data strobe signal of the other semiconductor chip by a half clock when a burst length of a read command of one (own) chip has the same number of clocks as that of the read command of the other chip. With this delaying function, read commands can be received using the same timings as those in a customary one chip, without concern for an relation (or interval to avoid collision) between the read commands. Even if an output clock timing at which a data strobe signal of the (second) semiconductor chip (indicated by reference numeral 11b in FIGS. 1A and 1B) for last two addresses from the end of burst data goes high would coincide with a clock timing at which a data strobe signal of the (first) semiconductor chip (indicated by reference numeral 11a in FIGS. 1A and 1B) goes low due to a read command input later to this (first) semiconductor chip (indicated by reference numeral 11a in FIGS. 1A and 1B), data of opposite levels will not be simultaneously output to data strobe signal output drivers of the two chips. Accordingly, increase in a circuit current and unstable operation of a data strobe signal level due to collision between the data strobe signals will not be caused. Further, following the output of the data strobe signal of the (second) semiconductor chip (indicated by reference numeral 11b in FIGS. 1A and 1B), the data strobe signal of the (first) semiconductor chip (indicated by reference numeral 11a in FIGS. 1A and 1B) is output so that the data strobe signal of the (first) semiconductor chip (indicated by reference numeral 11a in FIGS. 1A and 1B) alternates. Accordingly, the data strobe signals become continuous in terms of time. A high-speed operation can be thereby performed. Examples of the present invention will be described below in detail with reference to drawings.

First Example

Figure 1B:
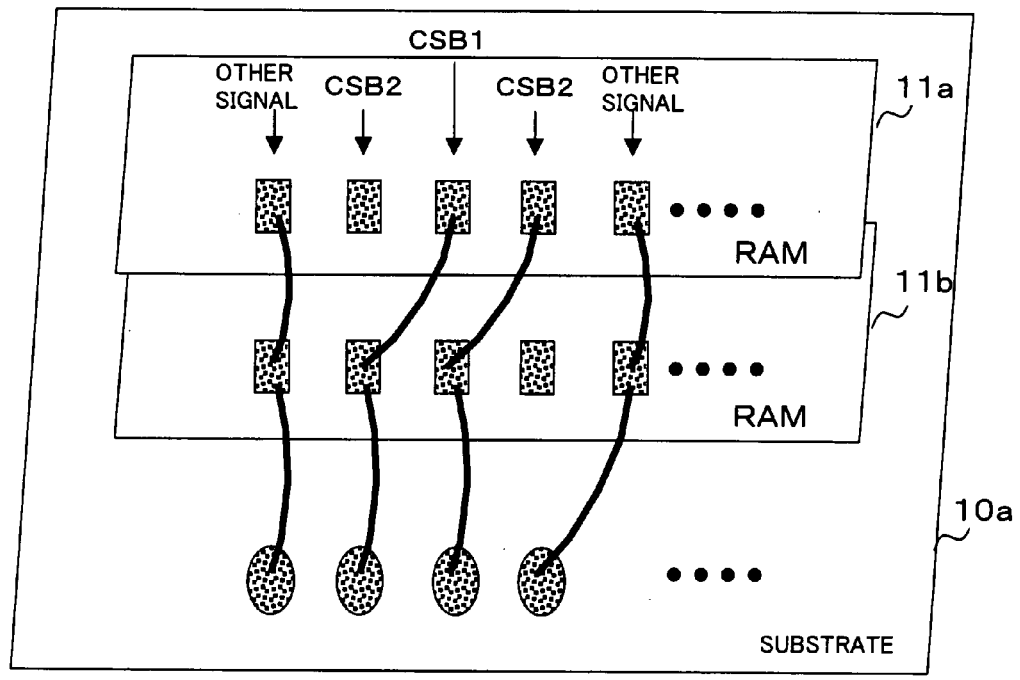

FIGS. 1A and 1B are block diagrams each showing a configuration of a semiconductor device according to a first example of the present invention. Referring to FIG. 1B, the semiconductor device includes RAMs 11a and 11b on a substrate 10a. The RAMs 11a and 11b are DDR SDRAMs or like having the same configuration as shown in FIG. 1A, and each of the RAMs 11a and 11b includes the strobe signal control unit 15a, a memory array & control unit 16, and a data input/output unit 17. Further, in the RAMs 11a and 11b, wiring for various signals is performed in common by bonding wires from the substrate 10a, as shown in FIG. 1B. Only wirings related to chip select signals CSB1 and CSB2 are formulated so that wiring positions of the signals CSB1 and CSB2 are transposed with each other between RAM 11a and RAM 11b.

The memory array & control unit 16 is a main unit of each of the RAM 11a and 11b, and operates on clock signals CLK and CLKB, command input signals RAS, CAS, and WE, and the chip select signals CSB1 and CSB2. When each of the RAMs 11a and 11b is in a write mode, the memory array & control unit 16 stores contents of the data signal DQ in a memory array corresponding to an address signal ADR via the data input/output unit 17. When each of the RAMs 11a and 11b is in a read mode, the memory array & control unit 16 outputs data stored in the memory array corresponding to the address signal ADR as the data signal DQ via the data input/output unit 17. Since contents of the memory array & control unit 16 and the data input/output unit 17 are well known in the DDR DRAM and the like, description of details of the memory array & control unit 16 and the data input/output unit 17 will be omitted.

Figure 2:
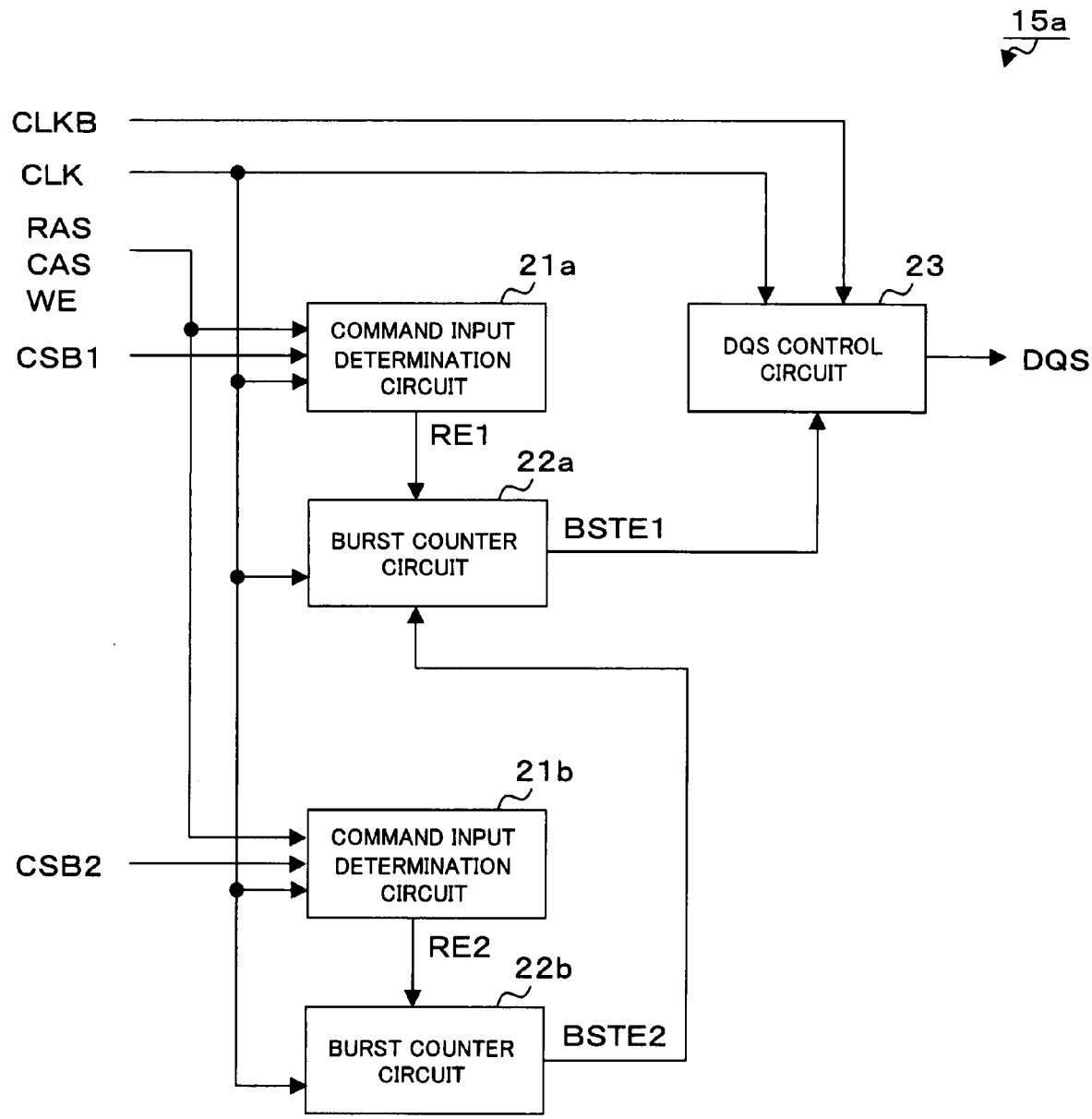
FIG. 2 is a block diagram showing a configuration of a strobe signal control unit according to the first example of the present invention.

FIG. 2 is a block diagram showing a configuration of the strobe signal control unit 15a. The strobe signal control unit 15a is a circuit that generates the data strobe signal DQS indicative of an output timing of the data signal DQ, and includes command input determination circuits 21a and 21b, burst counter circuits 22a and 22b, and a DQS control circuit 23. When the RAM is in the write mode, the strobe signal control unit receives the data strobe signal DQS from outside.

Since this function of the strobe signal control unit is not related to the present invention, a description of this function will be omitted.

The command input determination circuit 21a receives the clock signal CLK, command input signals RAS, CAS and WE, and chip select signal CSB1, and outputs to the burst counter circuit 22a a read command signal RE1 indicative of the read state when the input signals satisfy a predetermined condition. The command input determination circuit 21b receives the clock signal CLK, command input signals RAS, CAS and WE, and chip select signal CSB2 for other chip, and outputs to the burst counter circuit 22b a read command signal RE2 indicative of the read state when the input signals satisfies the predetermined condition.

The burst counter circuit 22b receives the clock signal CLK and the read command signal RE2. The burst counter circuit 22b outputs to the burst counter circuit 22a a burst enable signal BSTE2 that has become active during a period of time corresponding to the predetermined number of clocks when the read command signal RE2 is active. The burst counter circuit 22a receives the clock signal CLK, read command signal RE1, and burst enable signal BSTE2. The burst counter circuit 22a outputs to the DQS control circuit 23 a burst enable signal BSTE1 that has become active during the period of time corresponding to the predetermined number of clocks when the read command signal RE1 is active. When the burst enable signal BSTE2 is active in this case, start of activation of the burst enable signal BSTE1 is delayed by a predetermined amount (e.g., corresponding to a half clock).

The DQS control circuit 23 receives the clock signal CLK, an inverse clock signal CLKB that has a phase inverse to that of the clock signal CLK, and burst enable signal BSTE1, and outputs the data strobe signal DQS corresponding to a period of time during which the burst enable signal BSTE1 is active.

Figure 3:
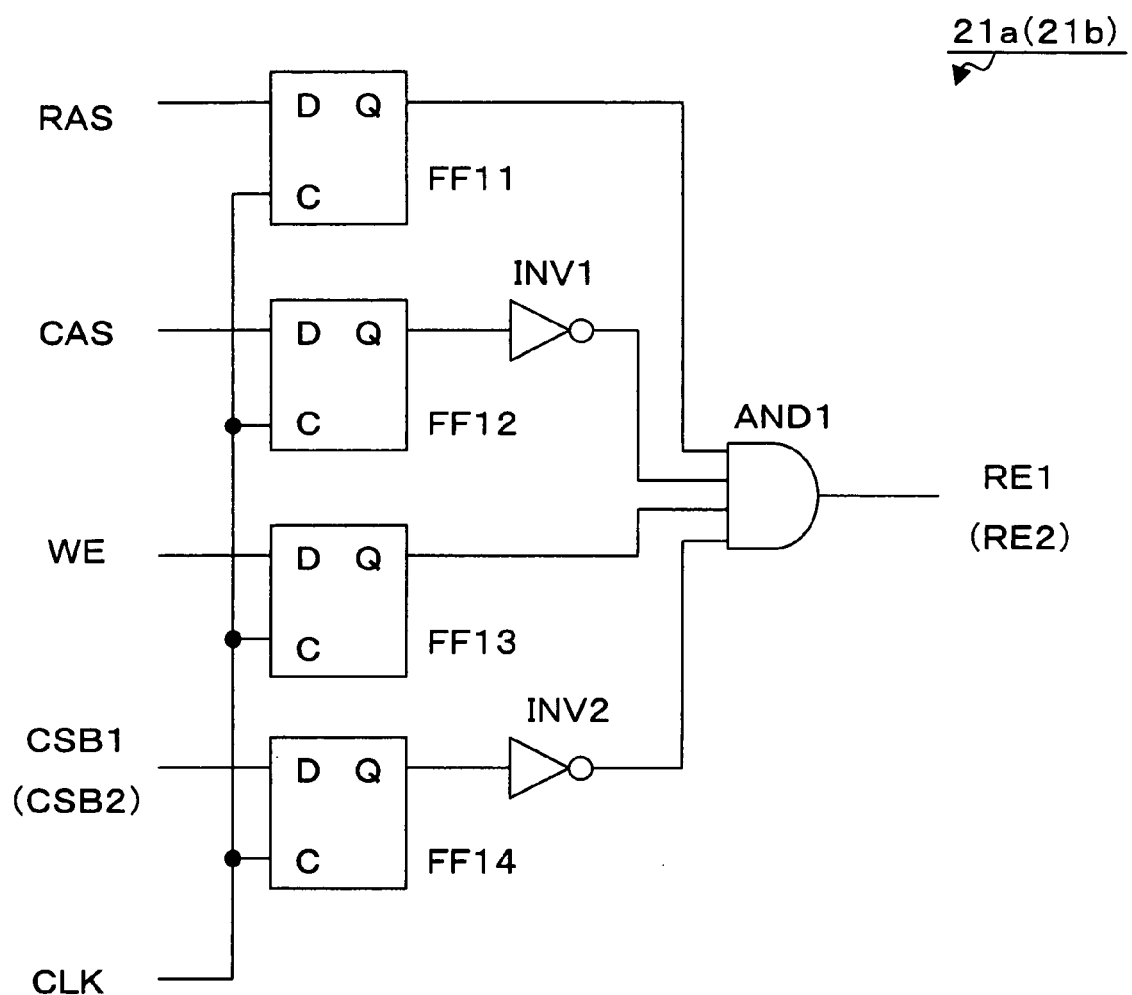
FIG. 3 is an example of a circuit diagram of a command input determination circuit.

FIG. 3 is a circuit diagram of each of the command input signal determination circuits 21a and 21b. Referring to FIG. 3, the command input determination circuit 21a (21b) includes D-flip flop circuits FF11 to FF14 which act as register circuits, inverter circuits INV1 and INV2, and a four-input AND circuit AND1. Each of the D-flip flop circuits FF11 to FF14 receives the clock signal CLK at a clock terminal thereof, and the D-flip flop circuits FF11 to FF14 also receive the command input signals RAS, CAS, WE, and the chip select signal CSB1 (CSB2) at a D terminal thereof, respectively. To respective inputs of the AND circuit AND1, a Q terminal of the D-flip flop circuit FF11, an output terminal of the inverter circuit INV1 that inverts an output of a Q terminal of the D-flip flop circuit FF12, a Q terminal of the D-flip flop circuit FF13, and an output circuit of the inverter circuit INV2 that inverts an output of a Q terminal of a D-flip flop circuit FF14 are connected. When the command input signals RAS CAS, WE, and the chip select signal CSB1 (CSB2) are High, Low, High, and Low, respectively, the read command signal RE1 (RE2) comes from an output terminal of the AND circuit AND1 goes High in synchronization with a fall of the clock signal CLK, which shows that the read command signal RE1 (RE2) is active.

Figure 4:
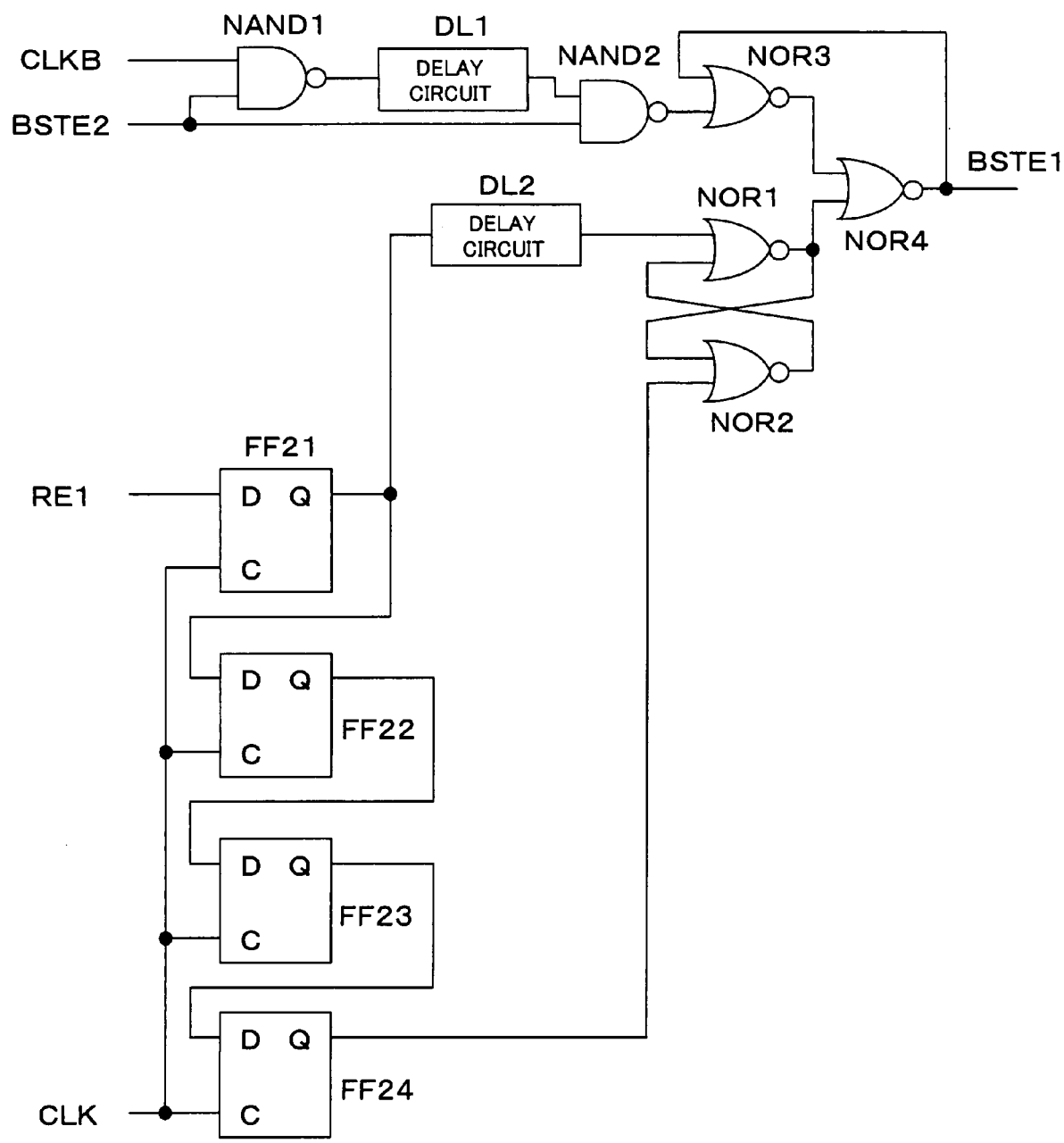
FIG. 4 is an example of a circuit diagram of a first burst counter circuit.

FIG. 4 is a circuit diagram of the burst counter circuit 22a. Referring to FIG. 4, the burst counter circuit 22a includes D-flip flop circuits FF21 to FF24, two-input NAND circuits NAND1 and NAND2, two-input NOR circuits NOR1 to NOR4, and delay circuits DL1 and DL2. Each of the D-flip flop circuits FF21 to FF24 receives the clock signal CLK at a clock terminal thereof. The read command signal RE1 is input to a D terminal of the D-flip flop circuit FF21. The D-flip flop circuits FF21 to FF24 are cascade connected. A Q terminal of the D-flip flop circuit FF24 is connected to one end of inputs of the NOR circuit NOR2. A Q terminal of the D-flip flop circuit FF21 is connected to one end of inputs of the NOR circuit NOR1 via the delay circuit DL2. An output of the NOR circuit NOR1 is connected to the other end of the inputs of the NOR circuit NOR2, and an output of the NOR circuit NOR2 is connected to the other end of the inputs of the NOR circuit NOR1, so that the NOR circuits NOR1 and NOR2 form an RS flip-flop circuit.

The two-input NAND circuit NAND1 receives the burst enable signal BSTE2 at one end thereof and receives the clock signal CLKB at the other end thereof. An output of the two-input NAND circuit NAND1 is connected to one end of inputs of the NAND circuit NAND2 via the delay circuit DL1. The NAND circuit NAND2 receives the burst enable signal BSTE2 at the other end thereof and an output of the NAND circuit NAND2 is connected to one end of inputs of the NOR circuit NOR3. The output of the NOR circuit NOR1 is connected to one end of inputs of the NOR circuit NOR4. An output of the NOR circuit NOR4 is connected (fed back) to the other end of the inputs of the NOR circuit NOR3, and an output of the NOR circuit NOR3 is connected to the other end of the inputs of the NOR circuit NOR4, so that the NOR circuits NOR3 and NOR4 form an RS flip-flop circuit. An output of the NOR circuit NOR4 outputs the burst enable signal BSTE1.

Figure 5:
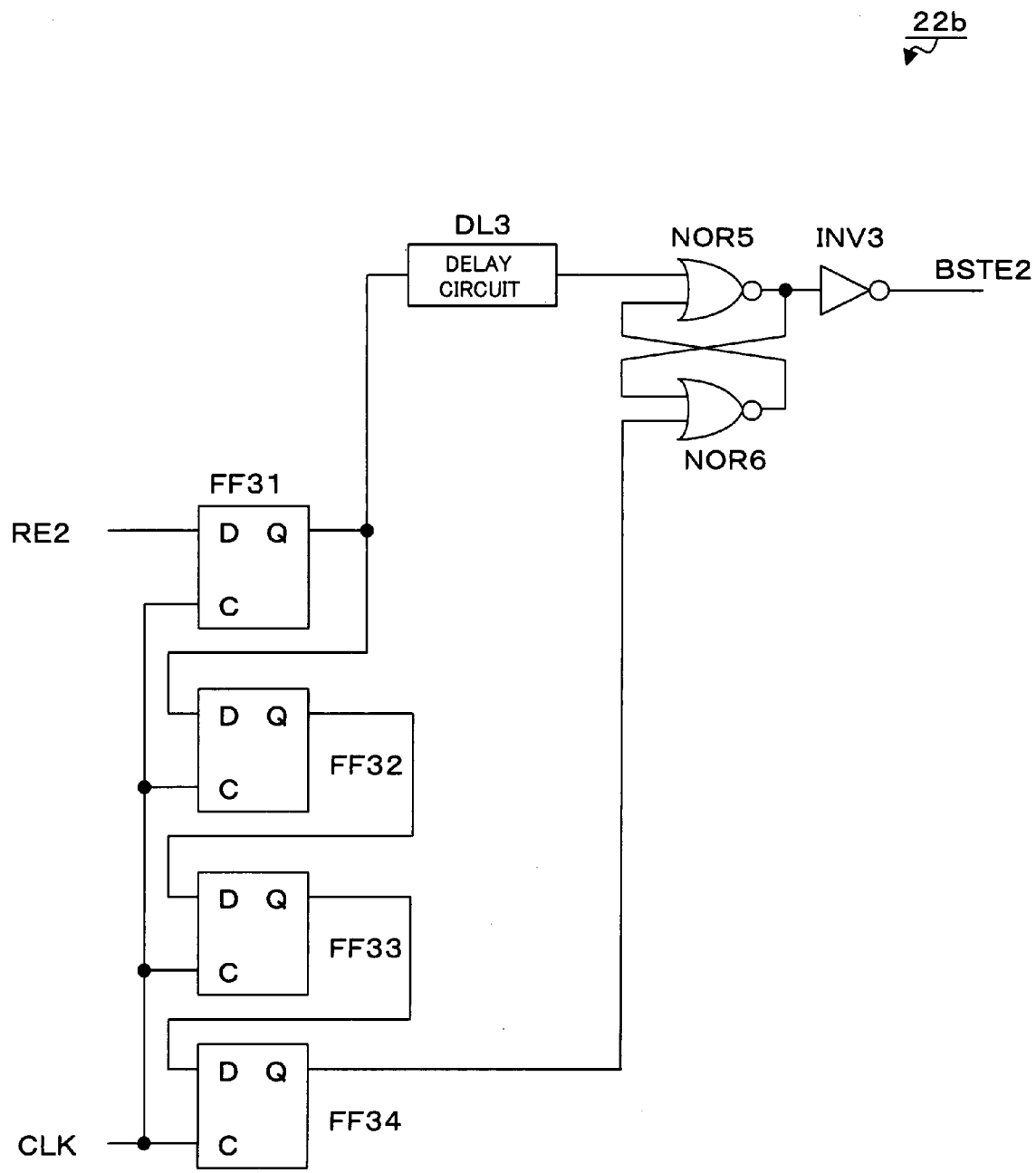
FIG. 5 is an example of a circuit diagram of a second burst counter circuit.

FIG. 5 is a circuit diagram of the burst counter circuit 22b. Referring to FIG. 5, the burst counter circuit 22b includes D-flip flop circuits FF31 to FF34, two-input NOR circuits NOR5 and NOR6, an inverter circuit INV3 and a delay circuit DL3. Each of the D-flip flop circuits FF31 to FF34 receives the clock signal CLK at a clock terminal thereof. The read command signal RE2 is input to a D terminal of the flip-flop circuit FF31. The D-flip flop circuits FF31 to FF34 are cascade-connected. A Q terminal of the D-flip flop circuit FF34 is connected to one end of inputs of the NOR circuit NOR6. A Q terminal of the D-flip flop circuit FF31 is connected to one end of inputs of the NOR circuit NOR5 via the delay circuit DL3. An output of the NOR circuit NOR5 is connected to the other end of the inputs of the NOR circuit NOR6, and an output of the NOR circuit NOR6 is connected to the other end of the inputs of the NOR circuit NOR5, so that the NOR circuits NOR5 and NOR6 form an RS flip-flop circuit. The output of the NOR circuit NOR5 outputs the burst enable signal BSTE2 via the inverter circuit INV3.

Figure 6:
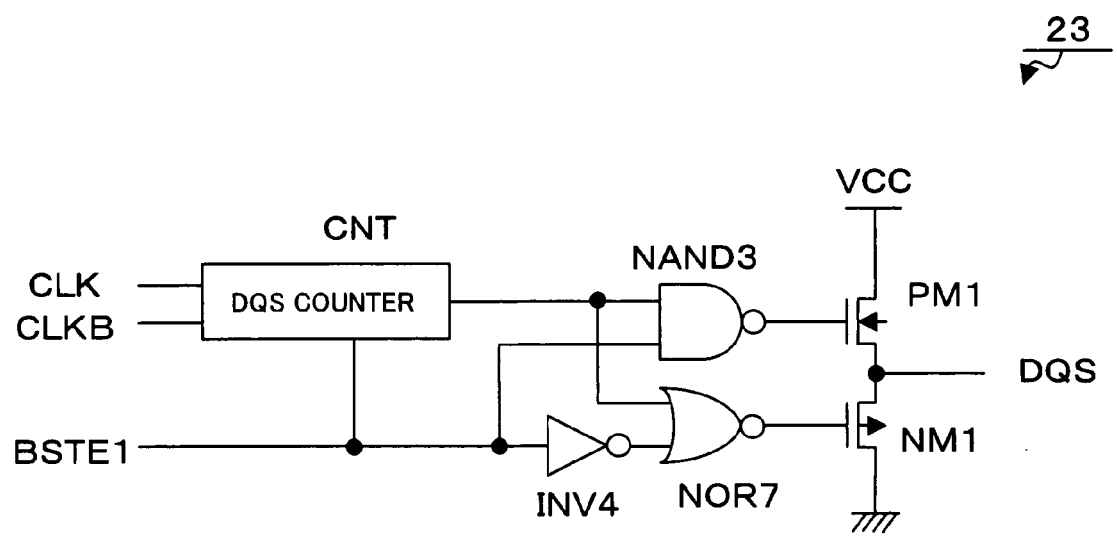
FIG. 6 is an example of a circuit diagram of a DQS control circuit.

FIG. 6 is a circuit diagram of the DQS control circuit 23. Referring to FIG. 6, the DQS control circuit 23 includes a DQS counter CNT, an NAND circuit NAND3, an NOR circuit NOR7, an inverter circuit INV4, a P-channel transistor PM1, and an N-channel transistor NM1. The DQS counter CNT receives the clock signals CLK and CLKB, counts the number of clocks during a period in which the burst enable signal BSTE1 is high, and outputs a high level to respective one ends of the NAND circuit NAND 3 and the NOR circuit NOR7. The burst enable signal BSTE1 is input to the other end of the NAND circuit NAND3. The burst enable signal BSTE1 is input to the other end of the NOR circuit NOR7 via the inverter circuit INV4. An output terminal of the NAND circuit NAND3 is connected to a gate of the P-channel transistor PM1 with a source thereof connected to a power supply VCC. An output terminal of the NOR circuit NOR7 is connected to a gate of the N-channel transistor NM1 with a source thereof grounded. Drains of the P-channel transistor PM1 and the N-channel transistor NM1 are connected to a common node which outputs the data strobe signal DQS. When the burst enable signal BSTE1 is low, an output of the DQS control circuit 23 becomes a high-impedance state.

When the burst enable signal BSTE1 is high, the DQS control circuit 23 buffers an output of the DQS counter CNT, followed by outputting.

Figure 7:
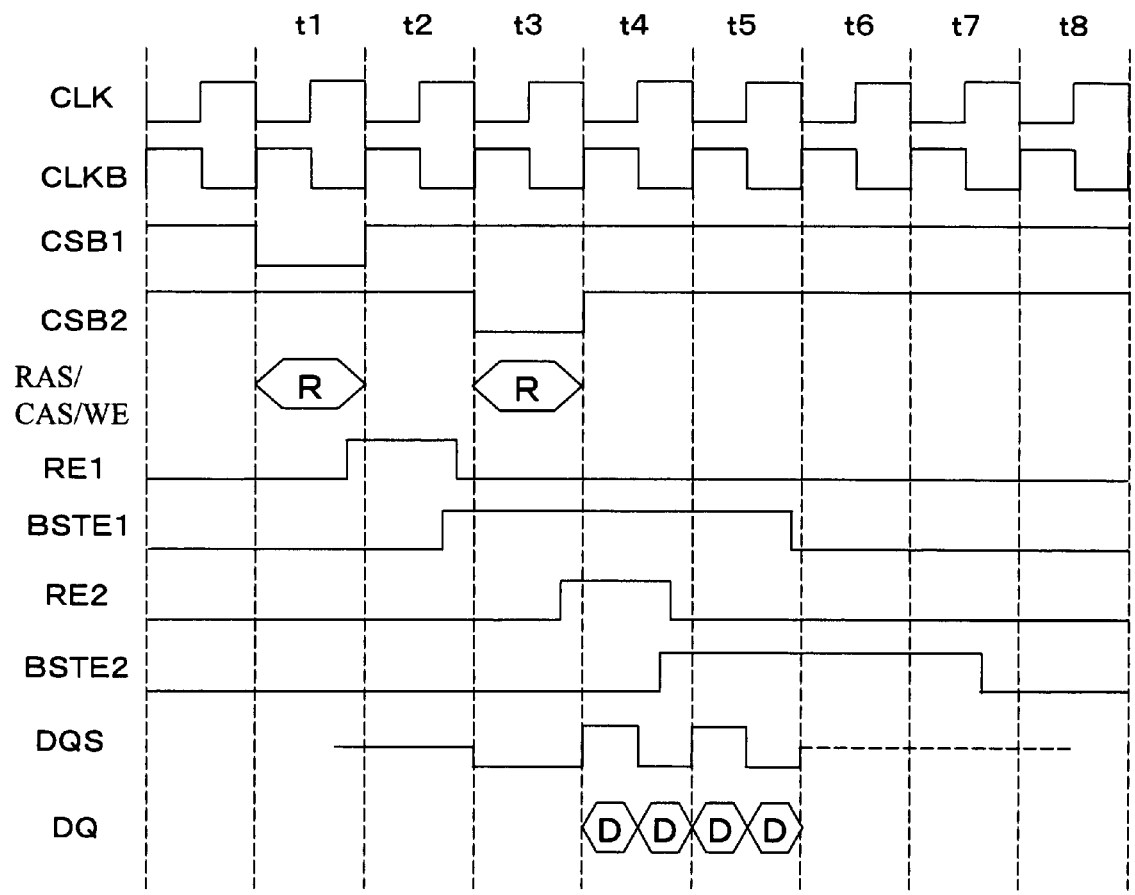
FIG. 7 is a timing chart of one RAM in the semiconductor device according to the first example of the present invention.
Figure 8:
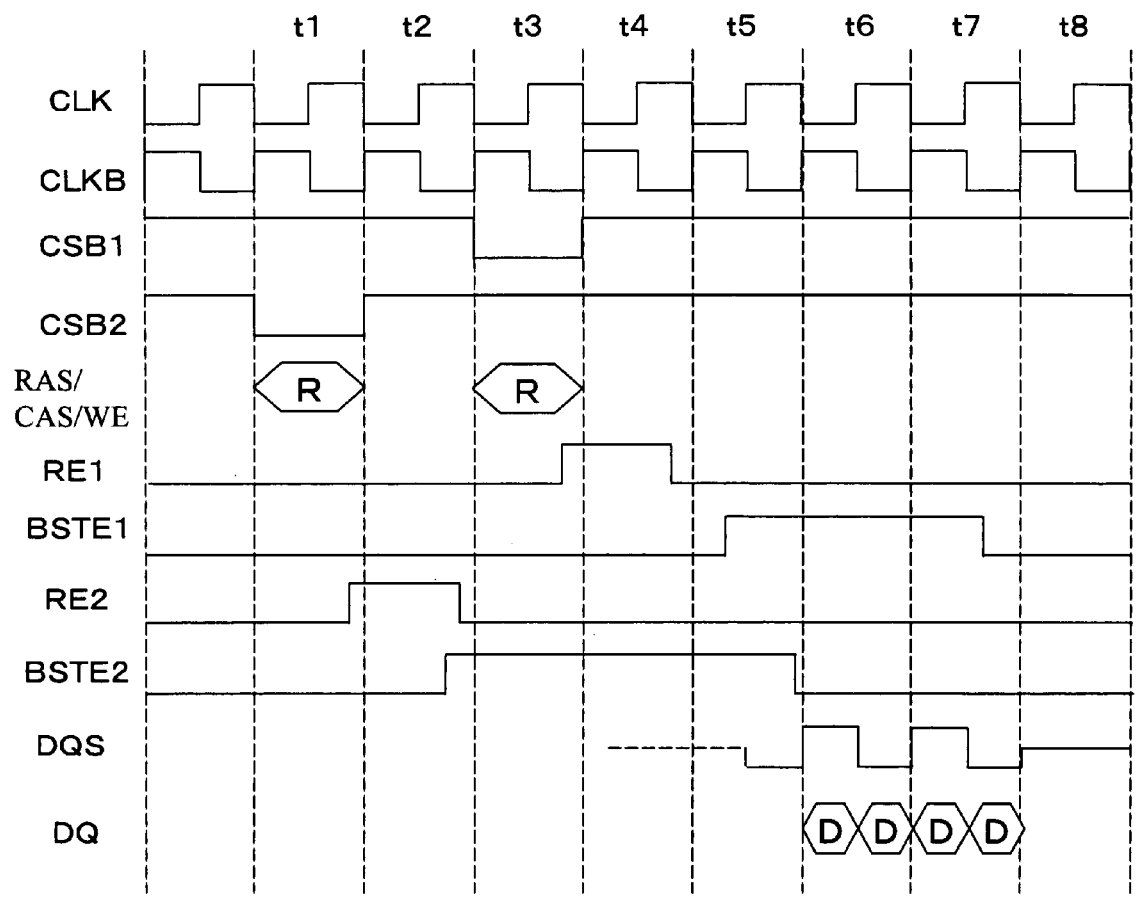
FIG. 8 is a timing chart of other RAM in the semiconductor device according to the first example of the present invention.

Next, operation of the semiconductor device configured as described above will be described. FIG. 7 is a timing chart on a side of the RAM 11*a*. FIG. 8 is a timing chart on a side of the RAM 11*b*. FIGS. 7 and 8 show a case where the number of CAS latencies is set to three and the number of burst operations is set to four. FIGS. 7 and 8 show a case where at timing t1, the RAM 11*b* is in a nonselected idle state, and a read command is input to the RAM 11*a*, and at timing t3, a read command is input to the RAM 11*b*. With respect to command inputs when the read command (R) is input, the command input signal RAS is high, the command input signal CAS is low, and the command input signal WE is high.

At the timing t1, the chip select signal CSB1 goes low. The RAM 11*a* thereby executes the read command. The clock signal CLK goes high. The signal at each D terminal of the D-flip flop circuits FF11 to FF14 is thereby latched in the command input determination circuit 21*a* in the RAM 11*a*. Then, high-level inputs are input to the AND circuit AND1, and the read command signal RE1 goes high (active). On the other hand, the chip select signal CSB2 is high. Thus, the read command signal RE2 in the command input determination circuit 21*b* remains low. Accordingly, the burst counter circuit 22*b* does not operate, and the burst enable signal BSTE2 remains low.

Next, in the burst counter circuit 22*a* to which the read command signal RE1 is input, an output of the D-flip flop circuit FF21 goes high at a timing t2. Then, since the burst enable signal BSTE2 is low, the burst enable signal BSTE1 after a time of delay through the delay circuit DL2 goes high (active).

The read command (R) is input to the RAM b on the counterpart at the timing t3. Likewise the case with BSTE1 at the timings t1 and t2, the burst enable signal BSTE2 goes high (active) at a timing t4 (FIG. 7). However, the burst enable signal BSTE1 has already gone (and remains) high, the RS flip-flop circuit formed of the NOR circuits NOR3 and NOR4 (FIG. 4) does not operate, and the burst enable signal BSTE1 maintains high.

Since the four D-flip flop circuits FF21 to FF24 are connected in series, an output of the D-flip flop circuit FF24 in a final stage goes high at a timing t5, for the burst enable signal BSTE1. The output of the NOR circuit NOR1 thereby changes to high, and the burst enable signal BSTE1 goes low. The number of stages of this register (the number of the D-flip flop circuits) is set to four for setting an operation timing using the data strobe signal DQS when the number of the CAS latencies is set to three and the number of the burst operations is set to four.

The DQS control circuit 23 that receives the burst enable signal BSTE1 uses the burst enable signal BSTE1 as a signal that controls an output of the data strobe signal DQS. For this reason, outputs of the P-channel transistor PM1 and the N-channel transistor NM1 for outputting the data strobe signal DQS are controlled by an output of the DQS counter CNT from a timing at which the burst enable signal BSTE1 has gone high. Synchronization of the data strobe signal DQS, which is an output of these transistors, is performed by the clock signals CLK and CLKB after the burst enable signal BSTE1 has gone high. Then, at the timing t3 during which the burst enable signal BSTE1 is high, the data strobe signal DQS goes low (into the preamble), and changes (alternates) between high and low during the timings t4 to t5, and functions as a synchronizing signal of the data signal DQ.

Then, at the timing t5, the burst enable signal BSTE1 goes low again. Thus, an output of the data strobe signal DQS becomes the high-impedance state again at an end of the timing t5. As described above, in the RAM 11*a*, data output is started according to the usual CAS latency, and the data strobe signal DQS performs an operation that is the same as that in a conventional art.

Next, an operation of the RAM 11*b* will be described using the timing chart in FIG. 8. At the timing t1, the RAM 11*b* is in a nonselected idle state. In the RAM 11*b*, in order to determine that the RAM 11*a* of the other party incorporated into the MCP is in the read state, an operation of the command input determination circuit 21*b* that receives the chip select signal CSB2 performs the same operation as the command input determination circuit 21*a* described earlier. That is, the signal RE2 indicating that the RAM 11*a* as the counterpart has received a read command goes high.

Next, the burst counter circuit 22*b* causes the burst enable signal BSTE2 to go high at the timing t2, like the burst counter circuit 22*a* described earlier.

At the timing t3, the read command is input to the RAM 11*b* itself this time. As a result, an operation of the command input determination circuit 21*a* becomes the same as that in the RAM 11*a* described earlier at the timing t1, and the read command signal RE1 goes high.

Next, at the timing t4, the burst counter circuit 22*a* operates. A difference from the operation of the RAM 11*a* described before is that the burst enable signal BSTE2 has already gone high. For this reason, the burst enable signal BSTE1 cannot go high at the timing t4, and remains low until the clock signal CLKB goes high at the timing t5. Then, after a lapse of a delay time through the delay circuit DL2 from the timing at which the clock signal CLKB has gone high, the burst enable signal BSTE1 goes high. This delay time is present so that a time point when the data strobe signal DQS on a side of the RAM 11*b* goes low at the timing t5 is delayed from a time point when the data strobe signal DQS on a side of the RAM 11*a* goes low. The DQS control circuit 23 to which the burst enable signal BSTE1 on the side of the RAM 11*b* is input does not output the data strobe signal DQS until the clock signal CLKB goes high at the timing t5. Accordingly, a start of the output of the data strobe signal DQS on the side of the RAM 11*b* is delayed by a half clock.

Operation after the timing t6 proceeds similarly to that after timing t4 in the RAM 11*a*. The burst enable signal BSTE1 goes low at the timing t7, and an output of the data strobe signal DQS becomes a high-impedance state at the timing t8.

Figure 9:
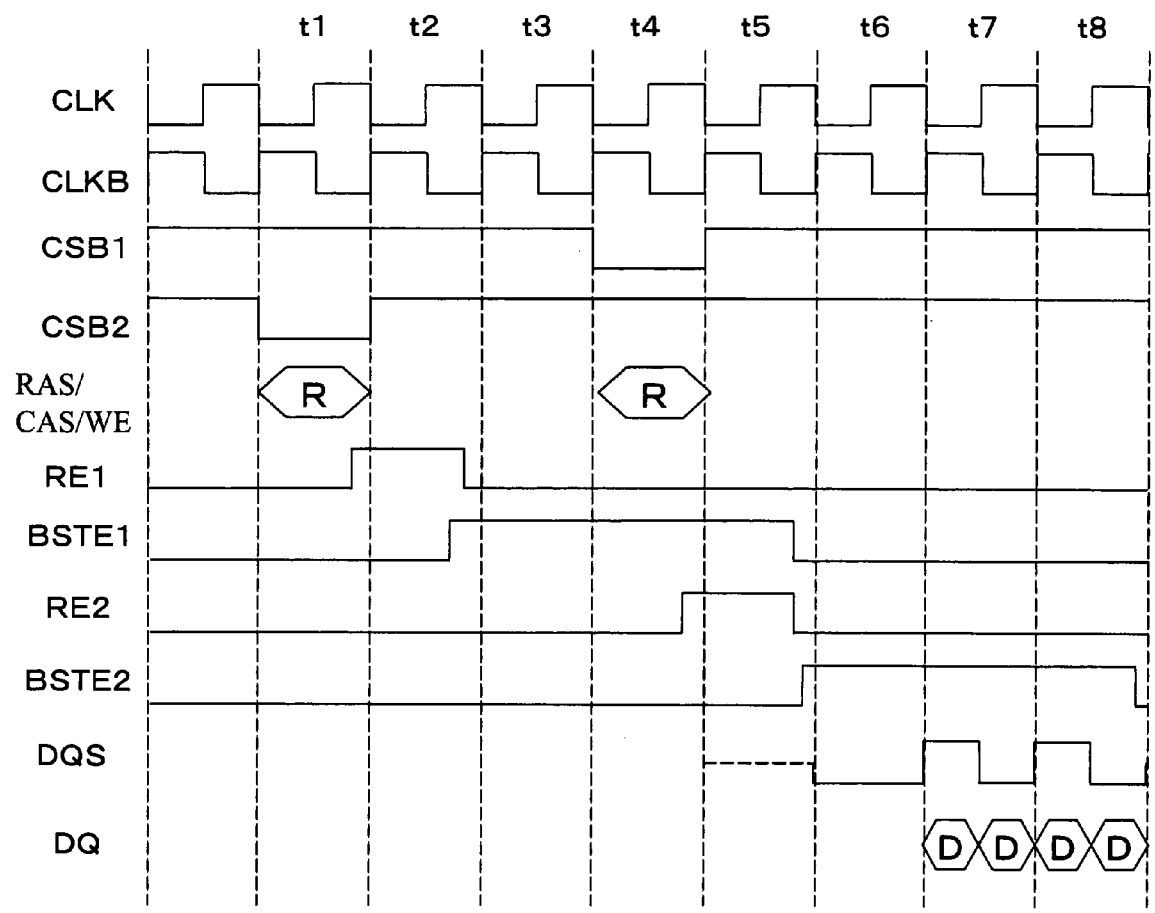
FIG. 9 is a further timing chart of the one RAM in the semiconductor device according to the first example of the present invention.
Figure 15:
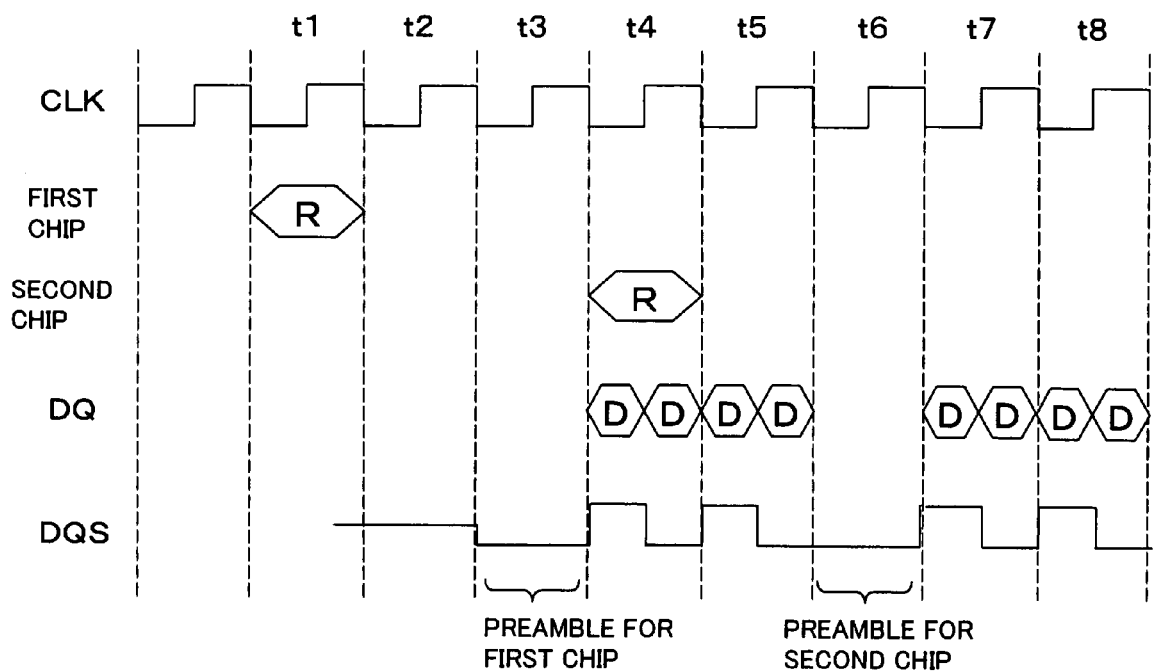
FIG. 15 is other timing chart of the RAM in the conventional semiconductor device.

Next, operation when a read command is input at the same timing as in the conventional art shown in FIG. 15 will be described. FIG. 9 is a timing diagram when the read command is input to the RAM 11*b* at the timing t4.

An operation until the timing t3 proceeds in the same way as that in FIG. 7. Since the read command is input to the RAM 11*b* at the timing t4, the read command signal RE2 in FIG. 9 is delayed by one clock from the read command signal RE2 of FIG. 7. Accordingly, the burst enable signal BSTE2 also goes high at the timing t5. At this point, the burst enable signal BSTE1 goes low. If the burst enable signal BSTE1 is delayed more than an output operation of the D-flip flop circuit FF31, an operation of the burst enable signal BSTE2 is delayed until the clock signal CLKB goes high at the timing t6. Thus, an output operation time of the register FF31 is delayed by the delay circuit DL3. With this arrangement, the data strobe signal DQS outputs a low level at the timing t6, and thereafter operates in the same manner as that in the conventional art.

As described above, the semiconductor device in this example operates so that following an output of the data strobe signal of the semiconductor chip 11a to which the (first) read command is input at the timing t1, the data strobe signal of the (second) semiconductor chip 11b to which the (second) read command is input at the timing t3 is output so that the data strobe signal of the (second) semiconductor chip 11b is continuous with the data strobe signal of the (first) semiconductor chip 11a and alternates. In this case, collision between the data strobe signals of both the chips does not occur. Thus, increase in the circuit current and any unstable operation of the data strobe signal level will not be caused.

Second Example

Figure 10A:
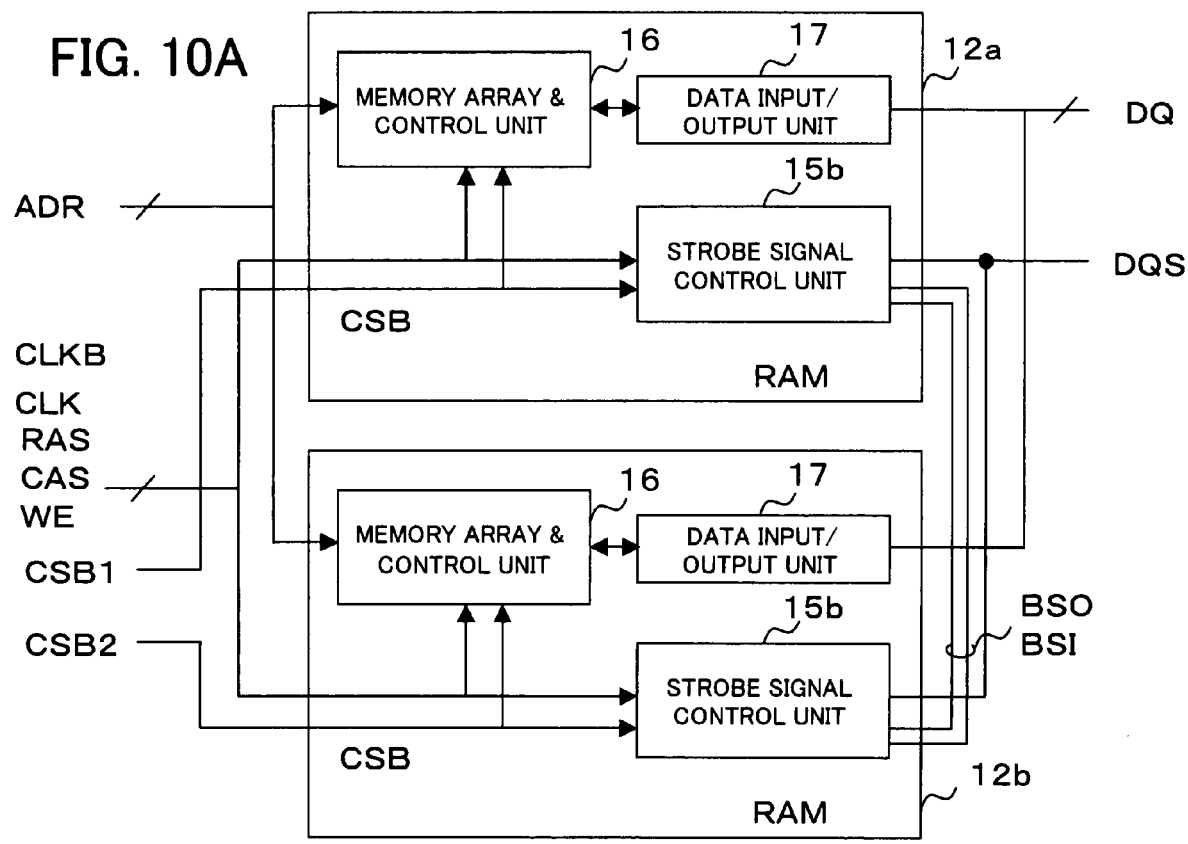
FIGS. 10A and 10B are block diagrams each showing a configuration of a semiconductor device according to a second example of the present invention.
Figure 10B:
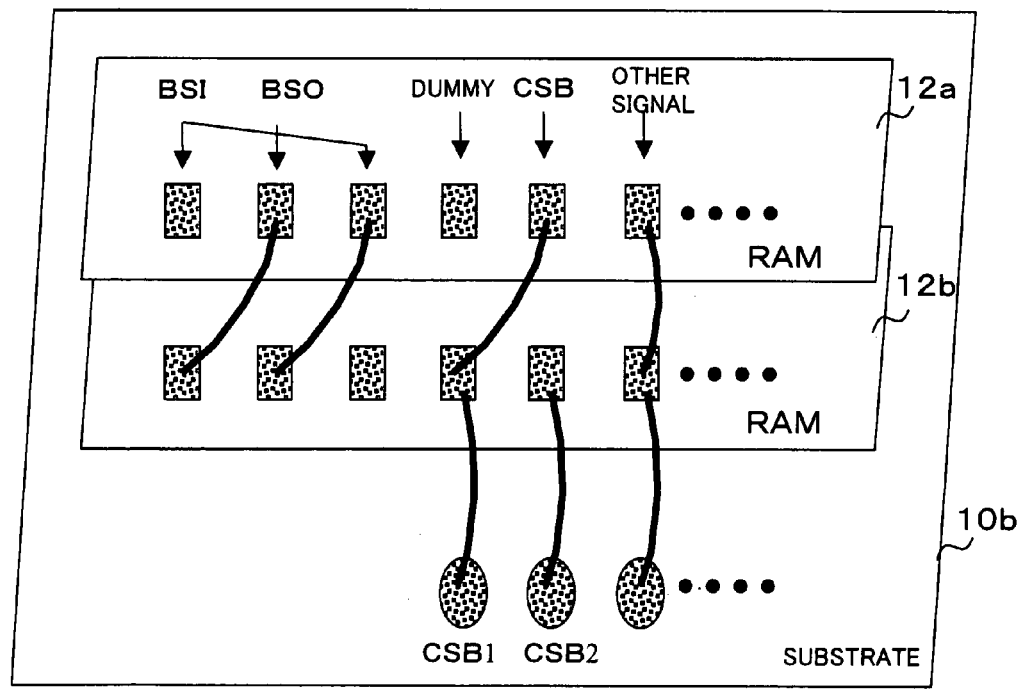

FIGS. 10A and 10B are block diagrams each showing a configuration of a semiconductor device according to a second example of the present invention. Referring to FIGS. 10A and 10B, same reference numerals as those in FIGS. 1A and 1B indicate same components, and descriptions of the same components will be omitted. The semiconductor device shown in FIGS. 10A and 10B includes RAMs 12a and 12b on the substrate 10b. Each of the RAMs 12a and 12b is the DDR SDRRAM having the same configuration as that as shown in FIG. 10A, and includes a strobe signal control unit 15b, the memory array & control unit 16, and the data input/output unit 17. As shown in FIG. 10B, to the RAMs 12a and 12b, wirings for various signals are routed in common from the substrate 10b by bonding wires, respectively. The chip select signal CSB1 is given as a chip select signal CSB for the RAM 12a. The chip select signal CSB2 is given as the chip select signal CSB for the RAM 12a. Wiring of the chip select signal CSB1 to the RAM 12a is made via a dummy terminal of the RAM 12b. Each of the RAMs 12a and 12b includes terminals for receiving/outputting signals BSO and BSI. A terminal related to the signal BSO of the RAM 12a and a terminal related to the signal BSI of the RAM 12b are connected. A terminal related to the signal BSI of the RAM 12a and a terminal related to the signal BSO of the RAM 12b are connected.

Figure 11:
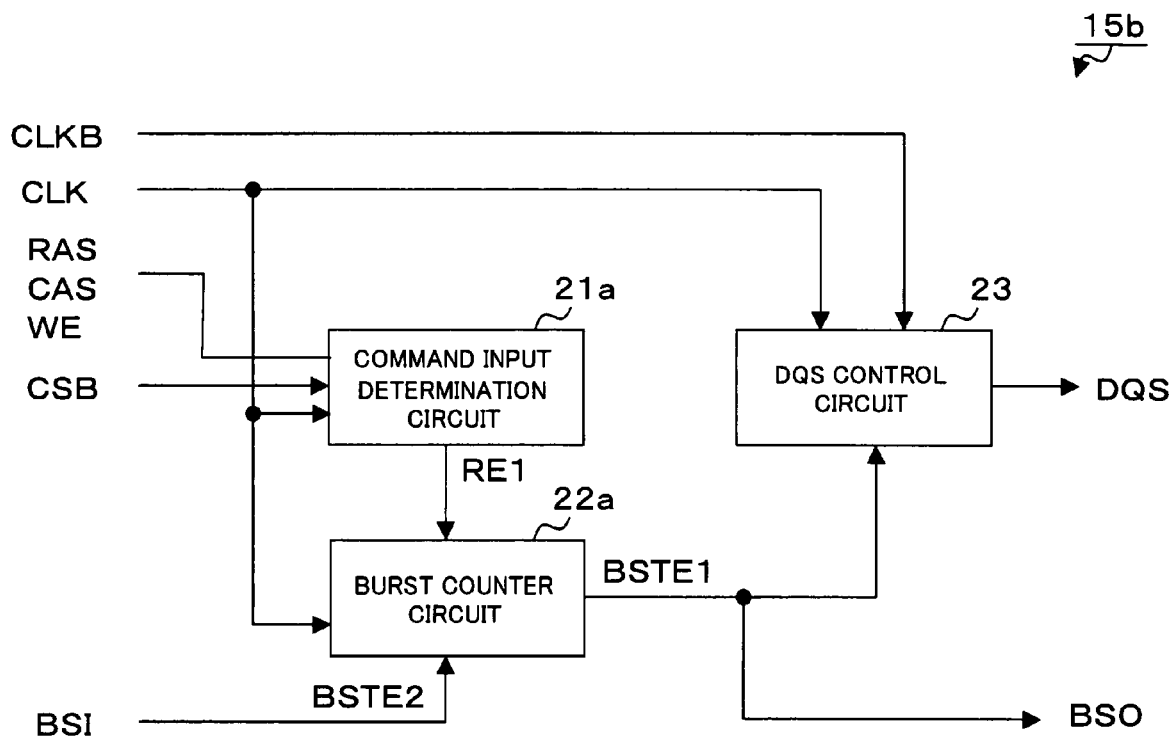
FIG. 11 is a block diagram showing a configuration of a strobe signal control unit according to the second example of the present invention.

FIG. 11 is a block diagram showing a configuration of the strobe signal control unit 15b. The strobe signal control unit 15b includes the command input determination circuit 21a, burst counter circuit 22a, and DQS control circuit 23. The command input determination circuit 21a receives the clock signal CLK, command input signals RAS, CAS and WE, and chip select signal CSB, and outputs to the burst counter circuit 22a the read command signal RE1 when the input signals satisfy the predetermined condition. The burst counter circuit 22a receives the clock signal CLK, read command signal RE1, signal BSI (corresponding to the burst enable signal BSTE2 in FIG. 2), and outputs the signal BSO (corresponding to the burst enable signal BSTE1) to the DQS control circuit 23.

In this configuration, the burst enable signal BSTE1 described in the first example is output to an output pad as the signal BSO as shown in FIG. 10B, and the signal BSI is directly input to the burst counter circuit 22a as the burst enable signal BSTE2 for the chip of the counterpart mounted by the MCP. Since an operation of the burst enable signal BSTE1 is the same as that in the first example, a description about a circuit operation will be omitted. In the semiconductor device in the second example, the number of wirings between chips is increased. However, the configuration of the strobe signal control unit 15b is simplified.

Third Example

Figure 12A:
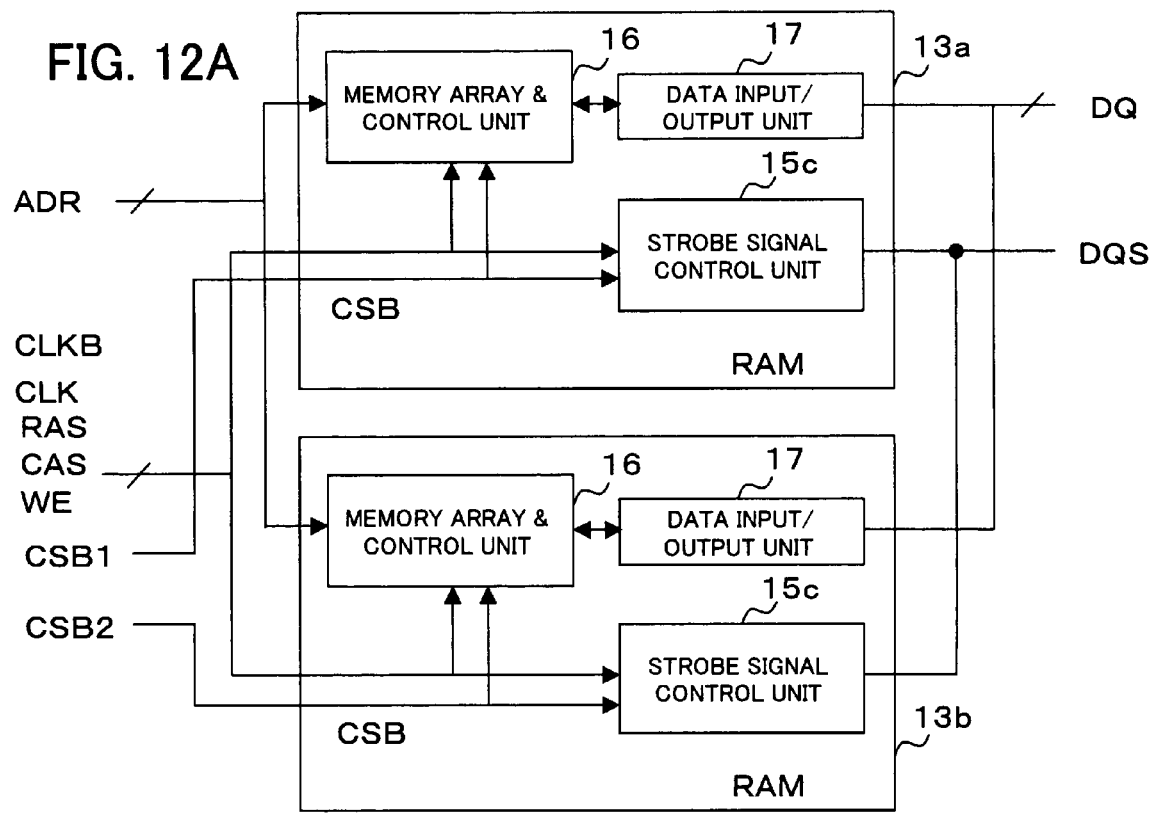
FIGS. 12A and 12B are block diagrams each showing a configuration of a semiconductor device according to a third example of the present invention.
Figure 12B:
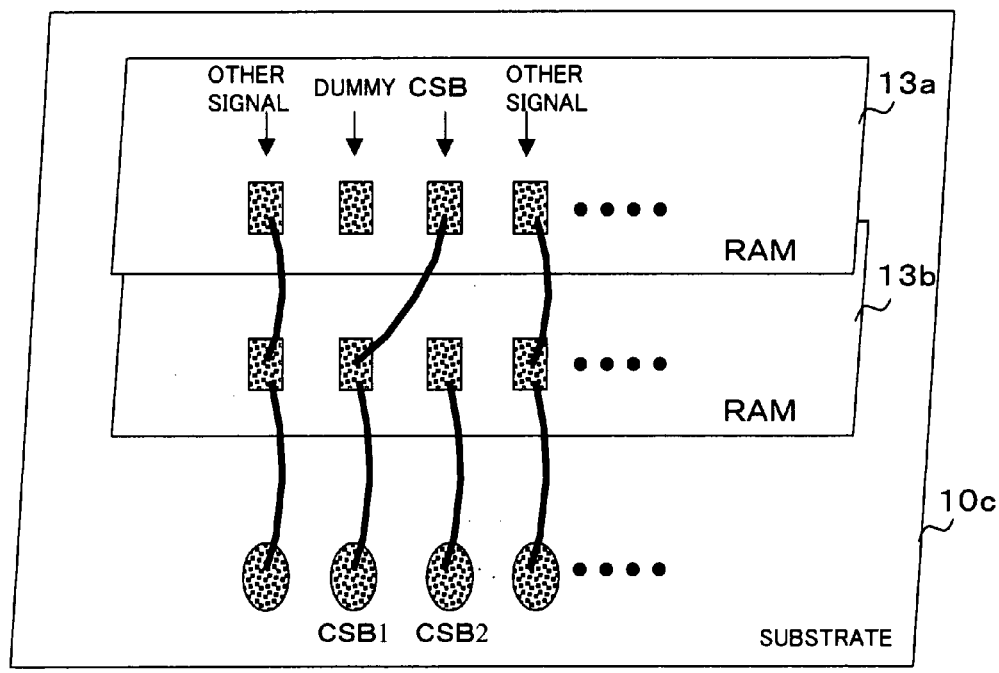

FIGS. 12A and 12B are block diagrams each showing a configuration of a semiconductor device according to a third example of the present invention. Referring to FIGS. 12A and 12B, same reference numerals as those in FIGS. 1A and 1B indicate same components, and descriptions of the same components will be omitted. The semiconductor device shown in FIGS. 12A and 12B includes RAMs 13a and 13b on a substrate 10c. Each of the RAMs 13a and 13b is the DDR SDRAM having the same configuration as that as shown in FIG. 12A, and includes a strobe signal control unit 15c, the memory array & control unit 16, and the data input/output unit 17. As shown in FIG. 12B, for the RAMs 13a and 13b, wirings for various signals are routed in common from the substrate 10c by bonding wires, respectively. The chip select signal CSB1 is given as the chip select signal CSB for the RAM 13a. The chip select signal CSB2 is given as the chip select signal CSB for the RAM 13b. Wiring of the chip select signal CSB1 to the RAM 13a is made via a dummy terminal of the RAM 13b.

Figure 13:
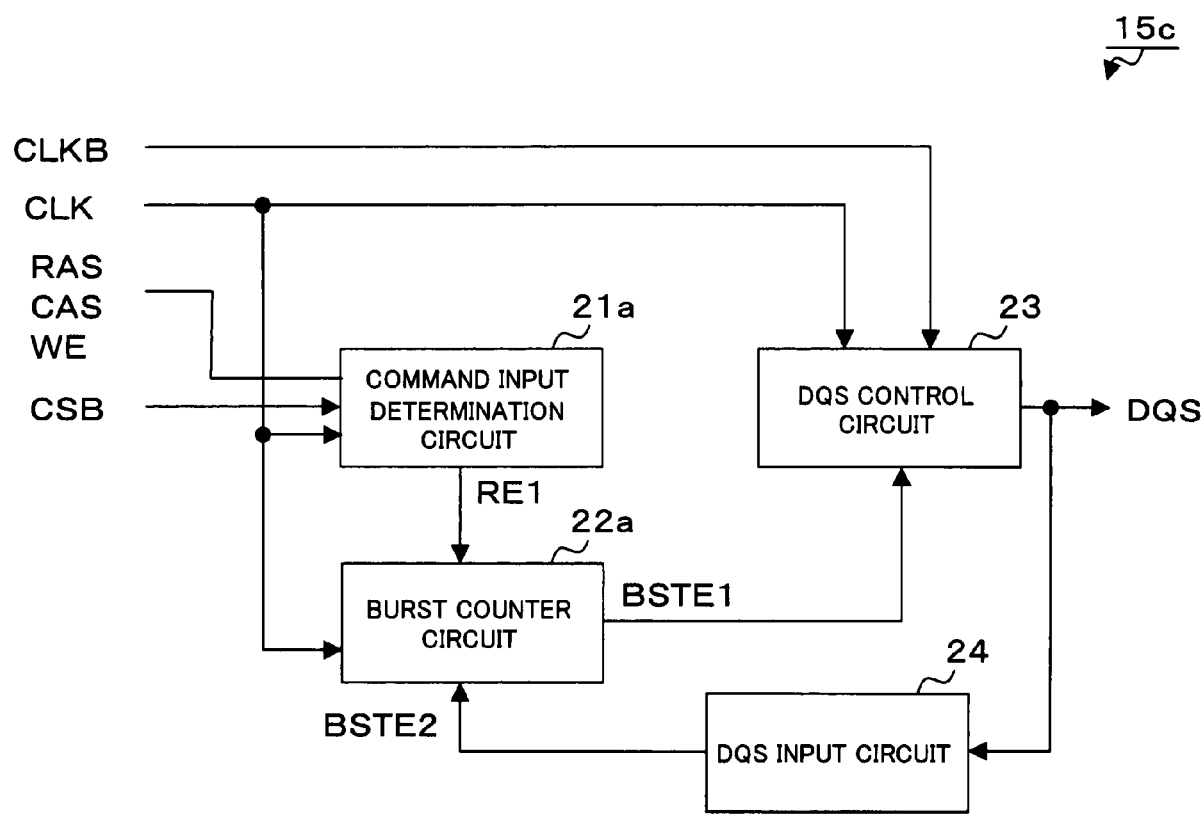
FIG. 13 is a block diagram showing a configuration of a strobe signal control unit according to the third example of the present invention.
Figure 14:
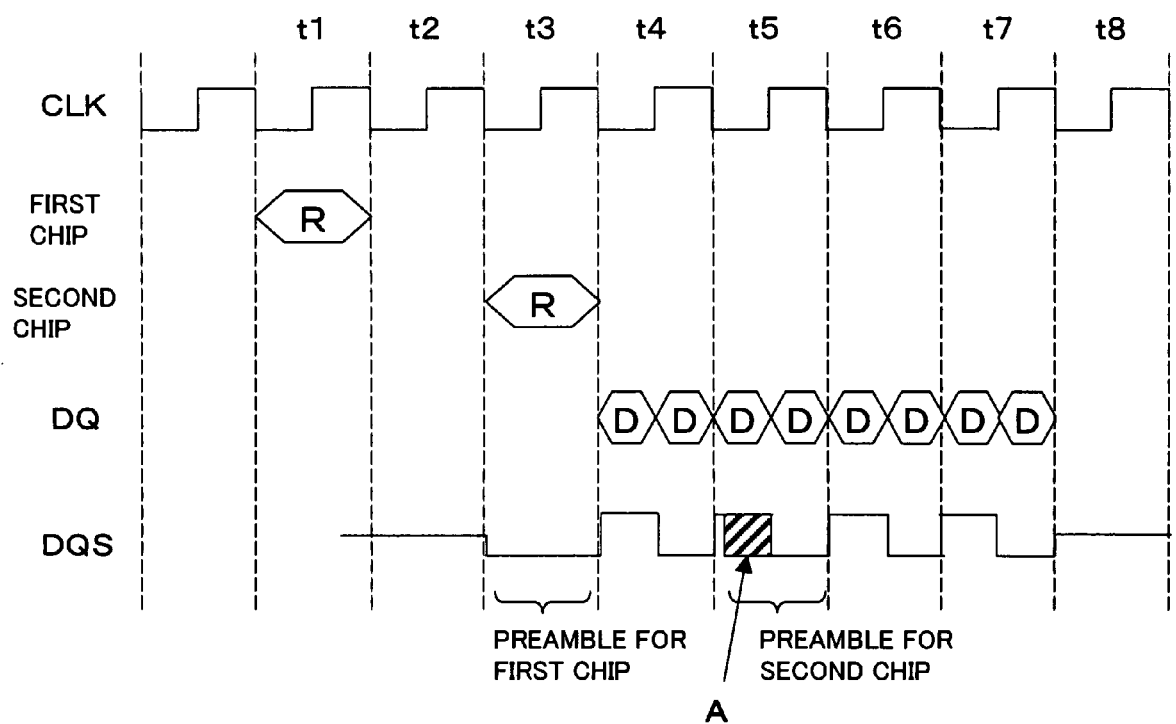
FIG. 14 is a timing chart of a RAM in a conventional semiconductor device.

FIG. 13 is a block diagram showing a configuration of the strobe signal control unit 15c. The strobe signal control unit 15c includes the command input determination circuit 21a, the burst counter circuit 22a, the DQS control circuit 23, and a DQS input circuit 24. The command input determination circuit 21a receives the clock signal CLK, command input signals RAS, CAS and WE, and chip select signal CSB, and outputs to the burst counter circuit 22a the read command signal RE1 when the input signals satisfy the predetermined condition. The burst counter circuit 22a receives the clock signal CLK, read command signal RE1, and burst enable signal BSTE2, and outputs the burst enable signal BSTE1 to the DQS control circuit 23. The DQS input circuit 24 receives the data strobe signal DQS which is connected in common between the RAMs 13a and 13b and output, and outputs the data strobe signal DQS to the burst counter circuit 22a as the burst enable signal BSTE2.

In the semiconductor device having the configuration as described above, with respect to the data strobe signal DQS, same determination as that when the burst enable signal BSTE2 in FIG. 2 is high is performed by utilizing common connection between the RAMs 13a and 13b. That is, when the data strobe signal DQS in the RAM of the counterpart is high, the DQS input circuit 24 outputs a high level to the burst counter circuit 22a as the burst enable signal BSTE2. With this arrangement, operation of the semiconductor device becomes the same as that described with reference to FIG. 8. Thus, the description about the operation will be omitted. An advantage of the semiconductor device in the third example is that the semiconductor device does not need wirings between chips related to the burst enable signals and the configuration of the semiconductor device is thereby simplified.

The above description was given in connection with the examples described above. The present invention, however, is not limited to the examples described above and of course includes various variations and modifications that could be made by those skilled in the art within the scope of the invention in each claim of this application.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   a plurality of semiconductor chips mounted thereon, said semiconductor device outputting a data signal and a data strobe signal indicative of an output timing of the data signal from said semiconductor chips, wherein
   being temporally continuous with a data strobe signal output corresponding to one of said semiconductor chips, a data strobe signal corresponding to an other one of said semiconductor chips is output so that the data strobe signal corresponding to said other one of said semiconductor chips alternates.

2. The semiconductor device according to claim 1, wherein said other one of said semiconductor chips comprises:
   a strobe signal control unit that determines whether said one of semiconductor chips is in a read state, and delays an output start timing of the data strobe signal when it is determined that said one of semiconductor chips is in the read state.

3. The semiconductor device according to claim 2, wherein the strobe signal control unit of said other one of semiconductor chips controls the output start timing so that a latter half portion of a preamble period of the data strobe signal to be output coincides with a postamble period of the data strobe signal output by said one of semiconductor chips.

4. A semiconductor chip that outputs a data signal and a data strobe signal indicative of an output timing of the data signal,
   said semiconductor chip comprising:
   a strobe signal control unit that determines whether an other semiconductor chip connected in parallel with said semiconductor chip is in a read state, and delays an output start timing of a data strobe signal when it is determined that said other semiconductor chip is in the read state.

5. The semiconductor chip according to claim 4, wherein said strobe signal control unit controls output start timing such that a latter half portion of a preamble period of the data strobe signal to be output coincides with a postamble period of a data strobe signal output by said other semiconductor chip.

6. The semiconductor chip according to claim 4, wherein said strobe signal control unit comprises:
   a first command determination input circuit that receives a command input signal, determines whether the command input signal indicates a read command to the semiconductor chip, and outputs a first read command signal when it is determined that the command input signal indicates the read command to the semiconductor chip;
   a first burst counter circuit that performs control so that when a burst enable signal and the first read command signal in said other semiconductor chip are active, a timing of activating the burst enable signal in the semiconductor chip is delayed by a predetermined amount, said burst enable signal being a signal indicative of a sending status of the data strobe signal; and
   a DQS (data strobe signal) control circuit that outputs as the data strobe signal an alternating signal which includes a preamble and is synchronized with a clock signal subsequent to the preamble, corresponding to an active period of the burst enable signal in the semiconductor chip.

7. The semiconductor chip according to claim 5, wherein said strobe signal control unit comprises:
   a first command determination input circuit that receives a command input signal, determines whether the command input signal indicates a read command to the semiconductor chip, and outputs a first read command signal when it is determined that the command input signal indicates the read command to the semiconductor chip;
   a first burst counter circuit that performs control so that when a burst enable signal and the first read command signal in said other semiconductor chin are active, a timing of activating the burst enable signal in the semiconductor chip is delayed by a predetermined amount, said burst enable signal being a signal indicative of a sending status of the data strobe signal; and
   a DQS control circuit that outputs as the data strobe signal an alternating signal which includes a preamble and is synchronized with a clock signal subsequent to the preamble, corresponding to an active period of the burst enable signal in the semiconductor chip.

8. The semiconductor chip according to claim 6, wherein said strobe signal control unit further comprises:
   a DQS input circuit that buffers and outputs an output of said DQS control circuit,
   wherein the burst enable signal in said other semiconductor chip is set as an output signal of said DQS input circuit.

9. The semiconductor chip according to claim 7, wherein said strobe signal control unit further comprises:
   a DQS input circuit that buffers and outputs an output of said DQS control circuit,
   wherein the burst enable signal in said other semiconductor chip is set as an output signal of said DQS input circuit.

10. The semiconductor chip according to claim 6, wherein said strobe signal control unit further comprises:
    a second command determination input circuit that receives the command input signal, determines whether the command input signal indicates a read command to said other semiconductor chip, and outputs a second read command signal when it is determined that the command input signal indicates the read command to said other semiconductor chip; and
    a second burst counter circuit that receives the second read command signal and activates a second burst enable signal during a period corresponding to a predetermined number of clocks,
    wherein the burst enable signal in said other semiconductor chip is the second burst enable signal.

11. The semiconductor chip according to claim 7, wherein said strobe signal control unit further comprises:
    a second command determination input circuit that receives the command input signal, determines whether the command input signal indicates a read command to said other semiconductor chip, and outputs a second read command signal when it is determined that the command input signal indicates the read command to said other semiconductor chip; and
    a second burst counter circuit that receives the second read command signal and activates a second burst enable signal during a period corresponding to a predetermined number of clocks;
    the burst enable signal in said other semiconductor chip being the second burst enable signal.

12. A semiconductor device comprising:
    a plurality of the semiconductor chips according to claim 4;
    a substrate with said plurality of the semiconductor chips mounted thereon; and
    wirings through which selection signals for said plurality of the semiconductor chips are delivered from said substrate.

13. The semiconductor device according to claim 1, wherein the output of the data strobe signal of one of the semiconductor chips to which a first read command is input at a first timing, the data strobe signal of the other one of the semiconductor chips to which a second read command is input at a second timing is output by the semiconductor device such that the data strobe signal of the other one of the semiconductor chips is continuous with the data strobe signal of the one of the semiconductor chips and alternates.

14. The semiconductor device according to claim 13, wherein the data strobe signal is output from the semiconductor device such that a collision between the data strobe signals of the one of the semiconductor chips and the other one of the semiconductor chips is avoided according to a monitoring of a timing of a read signal of each of the plurality of semiconductor chips, and
wherein the plurality of semiconductor chips are mounted on a common substrate.

15. The semiconductor chip according to claim 4, wherein the strobe signal control unit comprises a first command determination input circuit that receives a command input signal, determines whether the command input signal indicates a read command to the semiconductor chip, and outputs a first read command signal when it is determined that the command input signal indicates the read command to the semiconductor chip.

16. The semiconductor chip according to claim 4, wherein the strobe signal control unit comprises:
a first burst counter circuit that performs control such that when a burst enable signal and a first read command signal in the other semiconductor chip are active, a timing of activating the burst enable signal in the semiconductor chip is delayed by a predetermined amount, the burst enable signal being a signal indicative of a sending status of the data strobe signal; and
a DQS (data strobe signal) control circuit that outputs as the data strobe signal an alternating signal which includes a preamble and is synchronized with a clock signal subsequent to the preamble, corresponding to an active period of the burst enable signal in the semiconductor chip.

17. The semiconductor chip according to claim 16, wherein the strobe signal control unit controls output start timing so that a latter half portion of a preamble period of the data strobe signal to be output coincides with a postamble period of a data strobe signal output by the other semiconductor chip.

18. The semiconductor chip according to claim 16, wherein said strobe signal control unit further comprises a DQS input circuit that buffers and outputs an output of said DQS control circuit, and
wherein the burst enable signal in said other semiconductor chip is set as an output signal of the DQS input circuit.

19. A semiconductor device comprising:
a substrate;
a first semiconductor chip mounted on the substrate and outputting a first data strobe signal and a first data signal;
a second semiconductor chip mounted on the substrate and communicating with the second semiconductor chip, the second semiconductor chip outputting a second data strobe signal and a second data signal; and
an output node outputting an output data strobe signal from the first data strobe signal and the second data strobe signal, the output data strobe signal being indicative of an output timing of the data signals from the first and second semiconductor chips,
wherein the first semiconductor chip monitors a read state of the second semiconductor chip and the second semiconductor chip monitors a read state of the first semiconductor chip, and
wherein the second data strobe signal is continuous with the first data strobe signal and alternates according to a monitoring of the read state of the first and second semiconductor chips.

20. The semiconductor device according to claim 19, wherein the first semiconductor chip comprises a strobe signal control unit that determines whether the second semiconductor chip is in the read state, and delays an output start timing of the first data strobe signal when it is determined that the second semiconductor chip is in the read state, and
wherein the second semiconductor chip comprises a strobe signal control unit that determines whether the first semiconductor chip is in the read state, and delays an output start timing of the second data strobe signal when it is determined that the first semiconductor chip is in the read state.

21. A semiconductor device comprising:
a plurality of semiconductor chips mounted thereon, said semiconductor device outputting a data signal and a data strobe signal indicative of an output timing of the data signal from said semiconductor chips,
wherein one of said semiconductor chips comprises:
a strobe signal control unit that determines whether another one of semiconductor chips is in a read state, and, when it is determined that said another one of semiconductor chips is in the read state, controls an output start timing such that a latter half portion of a preamble period of the data strobe signal to be output coincides with a postamble period of the data strobe signal output by said another one of semiconductor chips and that a former half portion of the preamble period is kept in a high-impedance state.

22. A semiconductor chip that outputs a data signal and a data strobe signal indicative of an output timing of the data signal, said semiconductor chip comprising:
a strobe signal control unit that determines whether another semiconductor chip connected in parallel with said semiconductor chip is in a read state, and, when it is determined that said another semiconductor chip is in the read state, controls an output start timing such that a latter half portion of a preamble period of the data strobe signal to be output coincides with a postamble period of a data strobe signal output by said another semiconductor chip and that a former half portion of the preamble period is kept in a high-impedance state.

23. The semiconductor chip according to claim 22, wherein said strobe signal control unit comprises:
determines whether the command input signal indicates a read command to the semiconductor chip, and outputs a first read command signal when it is determined that the command input signal indicates the read command to the semiconductor chip;
a first burst counter circuit that performs control so that when a burst enable signal and the first read command signal in said another semiconductor chip are active, a timing of activating the burst enable signal in the semiconductor chip is delayed by a predetermined amount, said burst enable signal being a signal indicative of a sending status of the data strobe signal; and
a DQS (data strobe signal) control circuit that outputs as the data strobe signal a preamble and a signal synchronized with a clock signal subsequent to the preamble, corresponding to an active period of the burst enable signal in the semiconductor chip.

24. The semiconductor chip according to claim 23, wherein said strobe signal control unit further comprises:
- a DQS input circuit that buffers and outputs an output of said DQS control circuit,
- wherein the burst enable signal in said another semiconductor chip is set as an output signal of said DQS input circuit.

25. The semiconductor chip according to claim 23, wherein said strobe signal control unit further comprises:
- a second command determination input circuit that receives the command input signal, determines whether the command input signal indicates a read command to said another semiconductor chip, and outputs a second read command signal when it is determined that the command input signal indicates the read command to said another semiconductor chip; and
- a second burst counter circuit that receives the second read command signal and activates a second burst enable signal during a period corresponding to a predetermined number of clocks, wherein the burst enable signal in said another semiconductor chip comprises the second burst enable signal.

26. The semiconductor chip according to claim 22, wherein said strobe signal control unit receives a burst enable signal from said another semiconductor chip and controls the output start timing in response to the burst enable signal.

27. The semiconductor chip according to claim 22, wherein said strobe signal control unit receives a data strobe signal of said another semiconductor chip and controls the output start timing in response to the data strobe signal of said another semiconductor chip.

28. A semiconductor device comprising:
- a plurality of the semiconductor chips according to claim 22;
- a substrate with said plurality of the semiconductor chips mounted thereon; and
- wirings through which selection signals for said plurality of the semiconductor chips are delivered from said substrate.

* * * * *